United States Patent [19]
Burkett, Jr. et al.

[11] Patent Number: 5,169,320
[45] Date of Patent: Dec. 8, 1992

[54] SHIELDED AND WIRELESS CONNECTOR FOR ELECTRONICS

[75] Inventors: Franklin S. Burkett, Jr., Seminole; Allen Fernandez, Tampa, both of Fla.

[73] Assignee: Hercules Defense Electronics Systems, Inc., Clearwater, Fla.

[21] Appl. No.: 766,831

[22] Filed: Sep. 27, 1991

[51] Int. Cl.⁵ .............................. H01R 9/09
[52] U.S. Cl. ...................... 439/66; 439/69; 439/608; 439/591
[58] Field of Search .............. 439/66, 69, 74, 81, 439/82, 91, 262, 263, 265, 289, 295, 591, 608

[56] References Cited

U.S. PATENT DOCUMENTS

| | | | |
|---|---|---|---|
| 3,077,511 | 2/1963 | Bohrer et al. | 439/69 |
| 3,340,439 | 9/1967 | Henschen et al. | 439/608 |
| 4,144,509 | 3/1979 | Boutres | 439/608 |
| 4,688,864 | 8/1987 | Sorel | 439/69 |
| 4,710,133 | 12/1987 | Lindeman | |
| 4,733,172 | 3/1988 | Smolley | |
| 4,806,110 | 2/1989 | Lindeman | |
| 4,961,709 | 10/1990 | Noschese | 439/66 |
| 4,988,306 | 1/1991 | Hopfer, III et al. | 439/66 |
| 4,992,053 | 2/1991 | Lindeman et al. | |
| 5,007,843 | 4/1991 | Smolley | |
| 5,037,312 | 8/1991 | Casciatti et al. | 439/66 |

Primary Examiner—Paula A. Bradley
Attorney, Agent, or Firm—Mark D. Kuller; Mark Goldberg

[57] ABSTRACT

This invention provides shielded and wireless connectors for interconnecting electronic circuit boards that are stacked in metal carriers. Serial interconnectors through the carriers provide transmission line paths through the stacked layers through connector assemblies embedded in and fed through each carrier in collinear alignment with each other. Each of the embedded feed through connector assemblies has upper and lower button connectors interconnected by a metal conductor, all positions within an axial hole formed by a pair of substantially cylindrical dielectric inserts. The upper and lower button connectors protrude from the upper and lower surfaces of the upper and lower adjacent circuit boards, respectively. This invention provides connector assemblies having the ability to withstand very high inertial forces without degradation of the electrical contact with the metal pads of the respective circuit boards.

15 Claims, 4 Drawing Sheets

SHIELDED AND WIRELESS CONNECTOR FOR ELECTRONICS

This invention was made with Government support under contract DAAA 21-87-C-0160 awarded by the U.S. Army Armament Research Development and Engineering Center. The Government has certain rights in this invention.

BACKGROUND OF THE INVENTION

1. Field of the Invention

This invention relates to shielded and wireless connectors for interconnecting individual electronic card assemblies. More particularly, this invention relates to card assemblies interconnections which allow signals of one assembly to be isolated from signals of other assemblies and any other signal going to or from that assembly.

2. Description of the Background Art

Surface mount and hybrid component technologies currently permit very high density individual electronic circuit board designs. Further, multilayer electronic circuit board technologies currently permit high frequency analog signals to be isolated from digital signals through the appropriate allocation of individual processing functions and/or electrical signals to individual layers of a multilayer board. Specifically, internal metallized layers within the circuit board are often used to isolate high frequency analog or digital signals of one layer from signals of another layer.

Unfortunately, the level of manufacturing technology presently available limits multilayer circuit board designs to approximately 10 to 12 layers. Thus, in many complex electronic systems, 10 to 12 layers are insufficient to allow high frequency analog and digital signals to be constrained to the layers of the multilayer circuit board. Several individual multilayer circuit boards must therefore be employed, in which high frequency analog signals are limited to some boards and digital signals limited to other boards. However, these individual circuit boards must then be interconnected to each other.

Typically, interconnection of individual circuit boards is accomplished using chassis-mounted circuit card connectors and cables (or wires). Alternatively, circuit card connectors may be mounted onto a printed circuit mother board allowing printed circuit daughter boards to be plugged into the connectors. As determined by the printed circuit on the mother board, each daughter board may be interconnected to adjacent daughter boards or to distant daughter boards located several connectors away. In either arrangement, the long interconnections between individual circuit boards reduce system electrical performance by introducing timing and phase shift errors and by compromising the isolation of high frequency analog signals from digital signals.

U.S. Pat. Nos. 4,710,133 and 4,806,110 disclose related types of electrical mother and daughter board edge connectors designed to minimize interference between circuit board signals and extraneous signals. U.S. Pat. No. 5,007,843 discloses another type of edge connector which employs connector elements each composed of a strand of metal wire wadded together to form a "button" of wadded wire. U.S. Pat. No. 5,007,843 also discloses a circuit board cable harness which employs button connector elements. Finally, as shown in U.S. Pat. No. 4,992,053, improved interconnection of circuit boards has been proposed through the use of a plurality of button connector assemblies, each comprising a pair of button connector elements positioned on opposing ends of a metal slug, with the button connector elements and the slug being positioned within a hole in a block of insulative material and with the circuit boards being bolted about the insulative material In addition to signal isolation concerns, systems incorporating interconnecting signal wires or mother and daughter board arrangements, such as those discussed above, are difficult to design for very high inertial applications. Specifically, the interconnecting wires and the mother and daughter boards flex under the high inertial forces developed during periods of high shock or acceleration and are therefore subject to failure. Furthermore, metal covers that are often employed to shield individual circuit boards, also flex under the same conditions and are therefore also subject to similar failures.

In view of the foregoing, there presently exists a need for a shielded and wireless interconnection of individual circuit boards. There also exists a need for such shielded and wireless interconnection of circuit boards that is capable of withstanding very high inertial environments.

Therefore, it is an object of this invention to provide an apparatus which overcomes the aforementioned inadequacies of the prior art connectors and provides an improvement which is a significant contribution to the advancement of the circuit board interconnection art.

Another object of this invention is to provide an interconnection apparatus for circuit boards employing embedded feed-through connector assemblies that are fully shielded by the metal carrier in which they are embedded Another object of this invention is to provide an interconnection apparatus for circuit boards in which the impedance of the dielectric inserts of each aligned connector assemblies may be selected so as to achieve an optimal impedance for that serial interconnection, much in the same manner of selecting the optimal impedance of a transmission line.

Another object of this invention is to provide an interconnection apparatus for circuit boards having the ability to survive very high levels of shock and/or acceleration in excess of 1000 times the force of gravity without circuit board failure.

Another object of this invention is to provide an interconnection apparatus for circuit boards employing embedded feed-through connector assemblies that are designed so as to also survive very high levels of shock and/or acceleration without degrading their electrical contact with the metal pads of the respective circuit boards.

The foregoing has outlined some of the more pertinent objects of the invention. These objects should be construed to be merely illustrative of some of the more prominent features and applications of the intended invention. Many other beneficial results can be obtained by applying the disclosed invention in a different manner or modifying the invention within the scope of the disclosure. Accordingly, other objects and a fuller understanding of the invention may be had by referring to the summary of the invention and the detailed description of the preferred embodiment in addition to the scope of the invention defined by the claims taken in conjunction with the accompanying drawings.

SUMMARY OF THE INVENTION

For the purpose of summarizing this invention comprises a shielded and wireless interconnect apparatus for electronic circuit boards. More particularly, the invention comprises a plurality of stacked layers, each layer comprising a circuit board mounted to a metal carrier. Each metal carrier comprises an upper recess for receiving the circuit board and a lower recess for receiving the electrical components of its lower adjacent circuit board positioned within the upper recess of the lower adjacent carrier. In this stacked arrangement, each circuit board is fully enclosed within the recesses of the adjacent metal carriers. Thus, signals of one circuit board are isolated from signals of its adjacent (and distant) circuit boards.

The serial interconnections through the carriers form transmission line paths through the stacked layers. Each serial interconnection is accomplished by means of connector assemblies which are embedded within and feed-through each carrier in collinear alignment with each other. Each of the embedded feed-through connector assemblies comprises upper and lower button connectors interconnected by a metal conductor, all positioned within an axial hole formed by a pair of substantially cylindrical dielectric inserts. The upper and lower button connectors protrude from the upper and lower surfaces of the carrier to electrically contact metal pads on the lower and upper surfaces of the upper and lower adjacent circuit boards, respectively.

Importantly, the aligned metal pads on the upper and lower surfaces of each circuit board may be electrically connected to each other by means of a plated-through-hole. In this manner, serial interconnection with adjacent and distant circuit boards is easily accomplished. Moreover, the metal pads on the surfaces of a circuit board may be electrically connected by internal or external circuit traces to its circuit board.

It should be readily appreciated that the embedded feed-through connector assemblies are fully shielded by the metal carrier in which they are embedded. Most importantly, the impedance of the dielectric inserts of each aligned connector assemblies may be selected so as to achieve an optimal impedance for that serial interconnection, much in the same manner of selecting the optimal impedance of a transmission line.

Another feature of the shielded and wireless interconnection of the invention which utilizes metal carriers, is the ability to survive very high levels of shock and/or acceleration in excess of 1000 times the force of gravity. Specifically, the layers of circuit boards and metal carriers in a sandwiched, stacked configuration are capable of withstanding very high inertial forces, such as those experienced in cannon-launched applications. Moreover, the embedded feed-through connector assemblies are specifically designed so as to also survive very high levels of shock and/or acceleration without degrading their electrical contact with the metal pads of the respective circuit boards.

The foregoing has outlined rather broadly the more pertinent and important features of the present invention in order that the detailed description of the invention that follows may be better understood so that the present contribution to the art can be more fully appreciated. Additional features of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a fuller understanding of the nature and objects of the invention, reference should be had to the following detailed description taken in connection with the accompanying drawings in which.

Similar reference characters refer to similar parts throughout the several views of the drawings.

DETAILED DESCRIPTION OF THE PREFERRED EMBODIMENT

Figure 1:
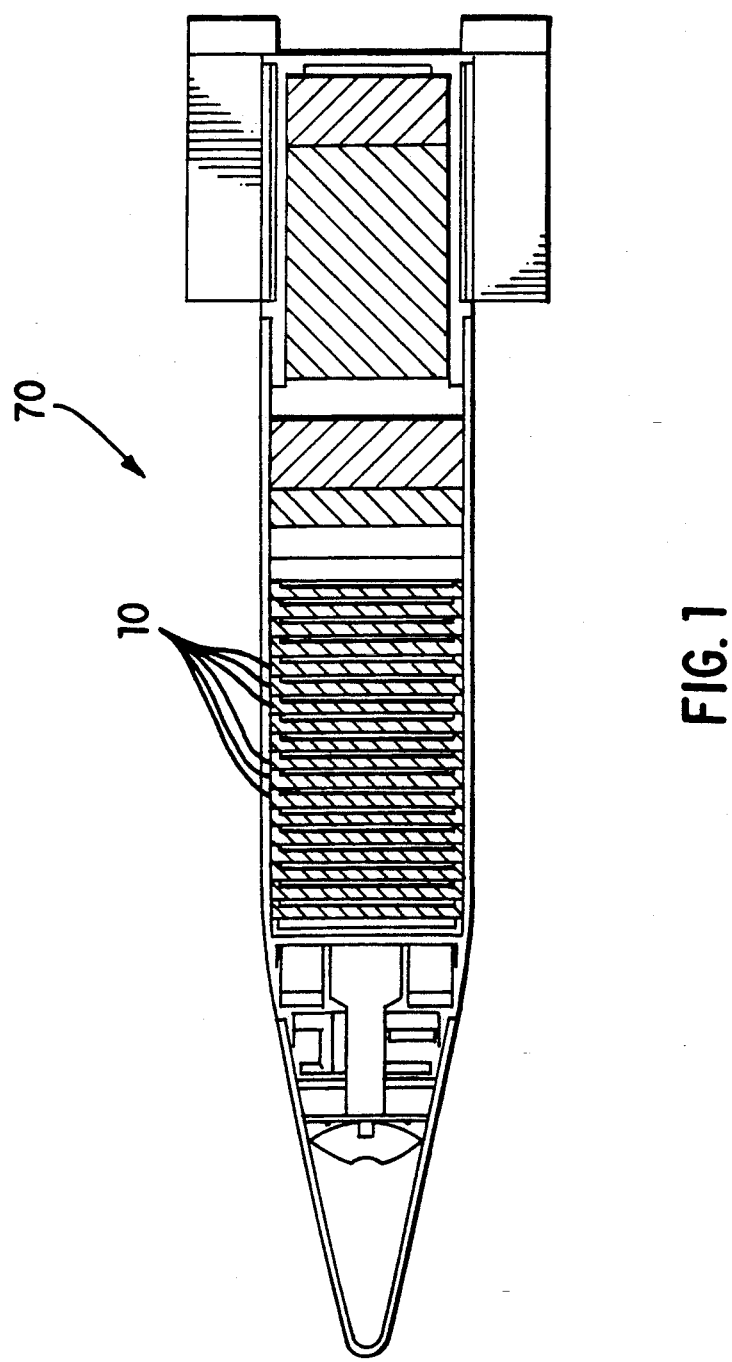
FIG. 1 is a diametrical cross-sectional view of the circuit board interconnect apparatus of the invention employed within a cannon-launched projectile.
Figure 2:
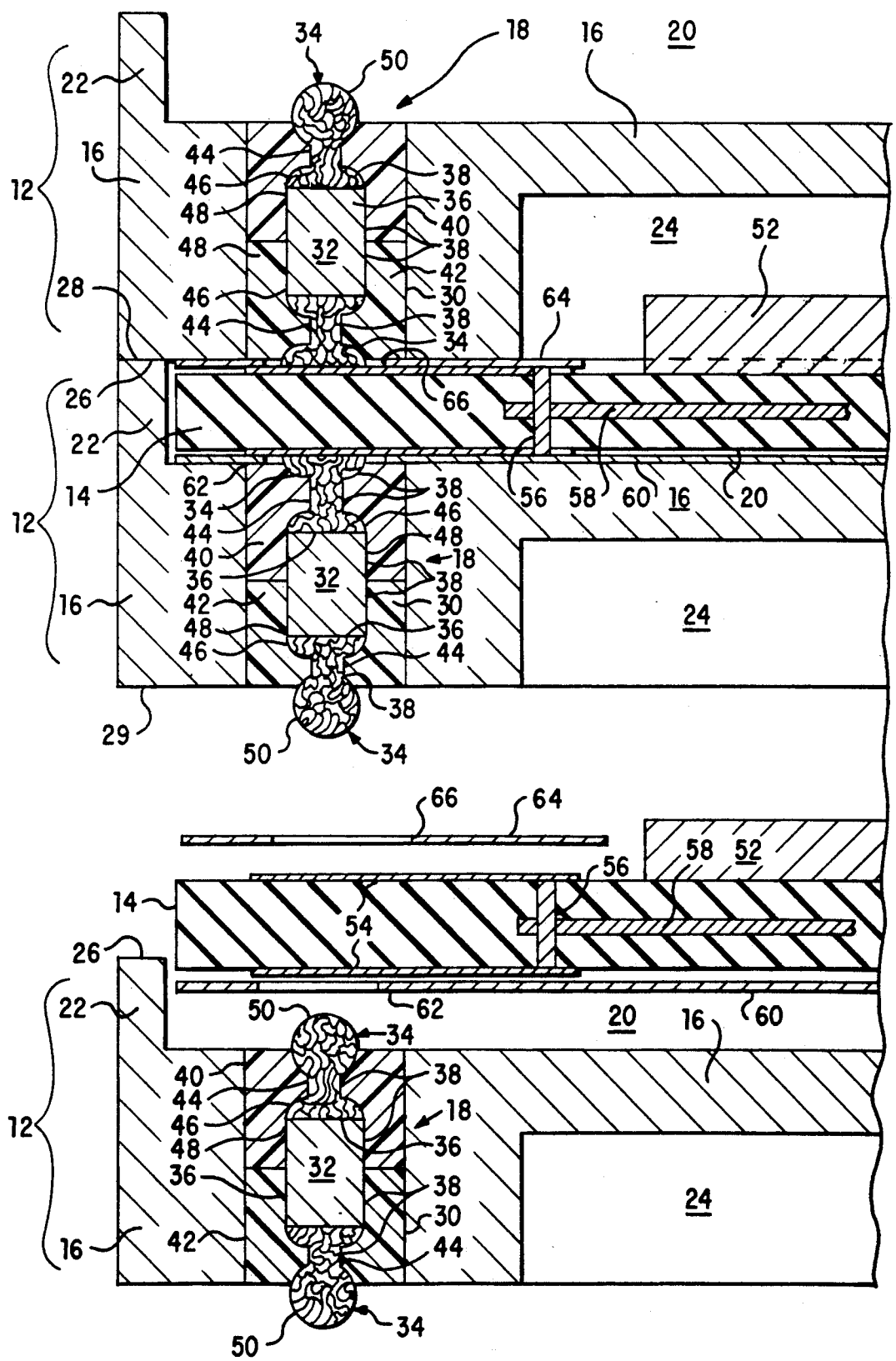
FIG. 2 is a partial enlarged view of FIG. 1, partially exploded, illustrating two circuit boards enclosed by adjacent metal carriers and illustrating a transmission line path formed by embedded feed-through connector assemblies.

As shown in FIGS. 1 and 2, the shielded and wireless interconnect apparatus 10 of the invention comprises a plurality of stacked layers 12, each layer 12 comprising a circuit board 14 mounted to a metal carrier 16. A plurality of connector assemblies, generally indicated by numeral 18, are embedded within the metal carrier 16 to protrude therefrom and interconnect its circuit board 14 with the circuit board 14 of the adjacent layer 12.

More particularly, each metal carrier 16 comprises an upper recess 20 defined by upstanding retaining edge 22 and a lower recess 24. The upper recess 20 defined by retaining edge 22 is configured and dimensioned so as to allow circuit board 14 to fit within the upper recess 20 and be bounded by the retaining edge 22. Similarly, lower recess 24 is configured and dimensioned so as to provide sufficient volume to receive the electrical components 52 of the lower adjacent circuit board 14 when the layers 12 are stacked together. Notably, when the layers 12 are stacked together, the upper surface 26 of the retaining edge 22 of one layer 12 electrically contacts the lower surface 28 of the upper adjacent metal carrier 16 so as to define fully enclosed recesses 20 and 24 of adjacent layers 12, thereby precluding any interference between the signals of the circuit board 14 positioned within the adjacent recesses 20 and 24.

The connector assemblies 18 are each positioned within a hole 30 formed through the metal carrier 16. Each of the connector assemblies 18 comprises a metal conductor 32 having a pair of button connectors 34 positioned at the end 36 of the metal conductor 32. The metal conductor 32 and its button connectors 34 are secured in axial alignment in an axial hole 38 formed by a pair of dielectric inserts 40 and 42 The dielectric inserts 40 and 42 are preferably retained within hole 30, such as by press fitting.

Preferably, each of the button connectors 34 are typically formed from a strand of gold plated resilient wire which is wadded together to form a nearly cylindrical "button" of wadded metal wire having a density of between 20 and 30%. As known in the art, these types of button connectors make electrical contact at multiple points when pressed against a contact area. Hence, button connectors have significant advantages over other types of connectors by providing low parasitic connections of high integrity and reliability with high current capability and zero insertion force. Furthermore, the compression force required for deflecting the button can be accurately predetermined based upon the metal wire and the density that the metal wire is wadded. Thus, button connectors are particularly advantageously employed in electronic assemblies subjected to high inertial forces since the percent button deflection for a particular rate of acceleration is easily predetermined.

Figure 5:
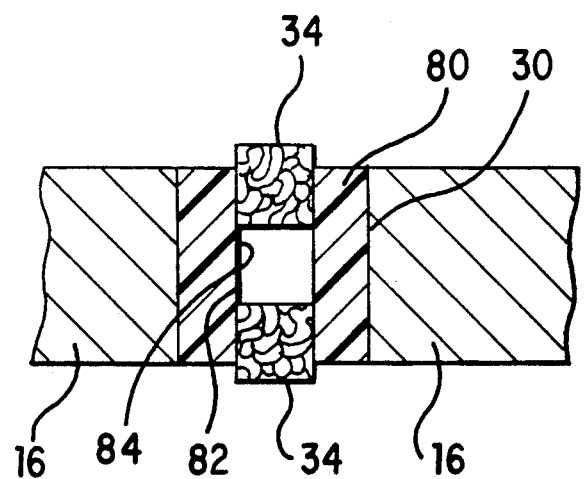
FIG. 5 is a diametrical cross-sectional view of another embodiment of a connector assembly.

As shown in FIG. 2, each of the dielectric inserts 40 and 42 include a reduced diameter portion 44 which functions to compress the midline of the button connector 34 positioned therein into an "hour-glass" configuration thereby retaining the button connector 34 therein. The reduced diameter portion 44 also functions to create a shoulder 46 which bears against the edges 48 of the metal conductor 32. Upon proper dimensioning, the metal conductor 32 may be securely retained within the axial holes 38 of the dielectric inserts 40 and 42 thereby precluding any axial movement of the metal conductor 32 within the axial holes 38. Finally, as shown in FIG. 2, the protruding ends 50 of the button connectors 34 may be rounded into a semi-circle configuration or, as shown in FIG. 5, may be formed into a cylindrical configuration.

The circuit board 14 comprises a conventional multilayer board having electrical components 52 mounted to the surface thereof. A pair of metal pads 54 are formed on the upper and lower surfaces of the circuit board 14 so as to electrically contact the protruding ends 50 of the button connectors 34 of adjacent connector assemblies 18. The metal pads 54 on opposing sides of the circuit board 14 are electrically interconnected by means of a plated-through-hole 56 extending transversely through the laminated layers of the circuit board 14. Notably, any one of the circuit functions of the circuit board 14 may be electrically connected to the metal pads 54 by means of an internal (or external) circuit traces 58.

A dielectric insulator 60 is preferably sandwiched between the lower surface of the circuit board 14 and the upper recess 20 so as to insulate the circuit board 14 from the metal carrier 16. However, the dielectric insulator 60 contains a plurality of holes 62 so as to permit the interconnection of the protruding ends 50 of the button connectors 34 with the respective metal pads 54 of the circuit board 14. Similarly, an upper dielectric insulator 64 with holes 66 is provided for positioning between the upper surface of the circuit board 14 and the lower surface 28 of the adjacent metal carrier 16 so as to insulate the circuit board 14 from the metal carrier 16 while allowing interconnection of the protruding ends 50 of the button connectors 34 with the respective metal tabs 54 of the circuit board via hole 66. This upper dielectric insulator 64 is shaped so as to allow room for the electrical components 52.

Returning to FIG. 1, it is seen that the shielded and wireless interconnect apparatus 10 of the invention is particularly suitable for use in connection with a cannon-launched projectile 70 which is subjected to acceleration forces. In this particular application, the circuit boards 14 and correspondingly, metal carrier 16, are preferably circular so as to define a substantially cylindrical configuration when the layers 12 are stacked together within the projectile 70 thereby forming a part of the support structure of the projectile and to define its overall design. Notwithstanding, it should be realized that other, non-circular configurations may be employed without departing from the spirit and scope of this invention.

Figure 3A:
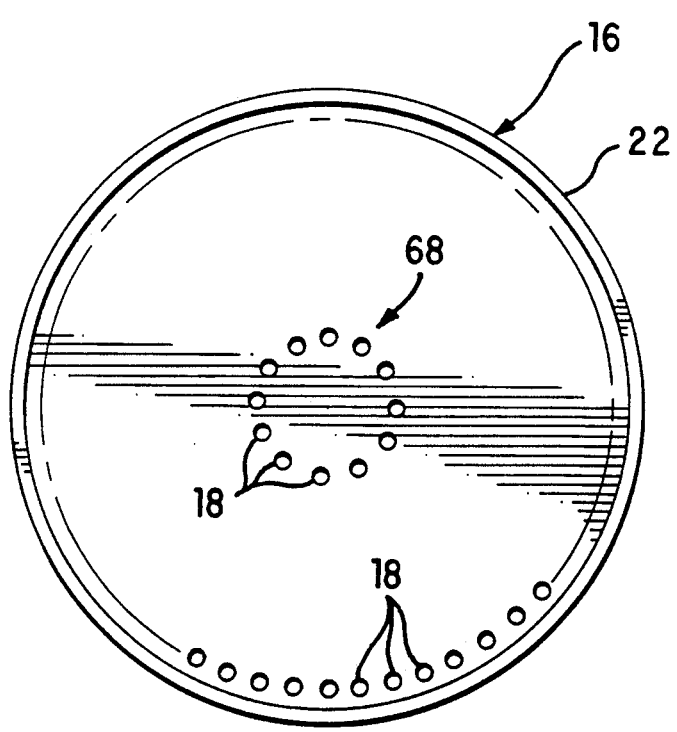
FIG. 3A is a top plan view of a metal carrier employing transmission line paths positioned in inner and outer circles and FIG. 3B is a diametrical cross-sectional view of FIG. 3A.
Figure 3B:
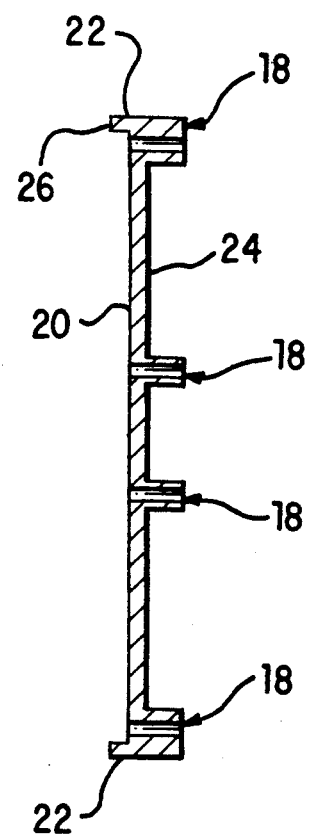

As shown in FIGS. 3A and 3B it should also be realized that a substantial plurality of aligned connector assemblies 18 may be employed so as to create many transmission line paths interconnecting adjacent and distant circuit boards 14 of the stack. Furthermore, while the foregoing description describe transmission line paths extending through the outer periphery of the stacked layers 12, it should be appreciated that the transmission line paths formed by the connector assemblies 18 and corresponding metal pads 54/plated-through-holes 56 may be formed through any area of the stacked layers 12, such as in a circular ring 68 of transmission line paths formed inwardly of the outer periphery of the metal carriers 16.

The shielded and wireless interconnect apparatus 10 of this invention offers many advantages. Specifically, the stacked arrangement of the layers of circuit boards 14 mounted within the recesses 20 and 24 of the metal carriers 16 result in each circuit board 14 being fully enclosed within the adjacent metal carriers 16. Thus, signals of one circuit board 14 in one layer are isolated from signals of adjacent and distant circuit boards 14 and from outside interference signals. The layers of the shielded and wireless interconnect apparatus 10 of this invention may therefore be optimally designed to isolate analog signals from digital signals (or any combination thereof). Similarly, the connector assemblies 18 are also fully shielded by the metal carriers 16 in which they are respectively embedded. Thus, each transmission line path formed by aligned connector assemblies 18 is electrically shielded, thereby preventing any electrical interference between adjacent and distant transmission line paths and from outside interferences.

Another important advantage is the fact that the metal carriers 16 provide structural support for the circuit boards 14 thereby increasing the ruggedness of the circuit boards 14 when employed in high inertial applications, such as shown in FIG. 1.

Figure 4:
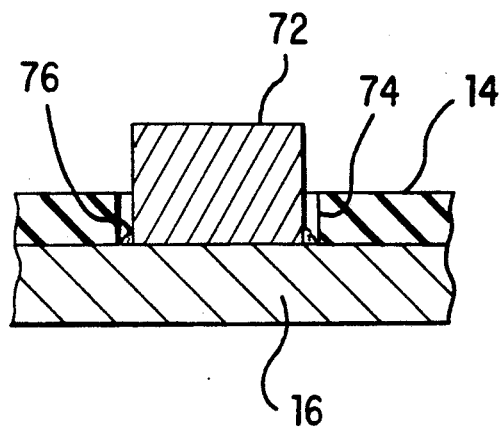
FIG. 4 is a diametrical cross-sectional view showing how heat energy is transferred from high powered components into the carrier for thermal management.

A still further advantage is the fact that the metal carriers 16 may function as a heat sink for high power components. Specifically, as shown in FIG. 4, high powered components 72 may be adhered, via a hole 74 in the circuit board 14, to the metal carrier 16 by means of a thermally conductive epoxy 76.

Finally, it should be noted that while one embodiment of the connector assemblies 18 is illustrated, others are possible without departing from the spirit and scope of this invention. For example, as shown in FIG. 5, connector assemblies 18 may comprise a sleeve 80 composed of a dielectric material having its lumen 82 plated with an electrically conductive material 84. The conductor buttons 34 may be cylindrically shaped and are retained in opposing ends of the sleeve 80 by additionally plating until the buttons 34 are bonded to the lumen 82 of the sleeve 80. The sleeve 80 is then press fitted into hole 30 of the metal carrier 16.

The present disclosure includes that contained in the appended claims, as well as that of the foregoing description. Although this invention has been described in its preferred form with a certain degree of particularity, it is understood that the present disclosure of the preferred form has been made only by way of example and that numerous changes in the details of construction and the combination and arrangement of parts may be resorted to without departing from the spirit and scope of the invention.

Now that the invention has been described,
What is claimed is:

1. An interconnect apparatus for interconnecting a circuit board, comprising in combination:
   a plurality of electrically conductive carriers stacked together with the circuit board enclosed within a recess defined by adjacent said carriers to electrically shield the circuit board from spurious signals;
   a plurality of transmission line paths extending through one of said carriers and said circuit board, said path comprising a connector assembly embedded within and feeding through said carrier to protrude therefrom and an electrically conductive pad formed on a side of the circuit board, said connector assemblies and said electrically conductive pad being positioned in collinear alignment to form said path, such that said path is electrically shielded from spurious signals.

2. The interconnect apparatus as set forth in claim 1, wherein the circuit board is insulated from said carriers by means of dielectric insulators positioned between the surfaces of the circuit board and the surfaces of said recess 3. The interconnect apparatus as set forth in claim 1, wherein the circuit board is planar and wherein a surface of said recess is planar allowing one of said carriers to structurally support the circuit board to withstand high inertial forces.

4. The interconnect apparatus as set forth in claim 1, wherein an electrical component mounted to the circuit board is thermally connected to one of said carriers allowing said carrier to function as a heat sink.

5. The interconnect apparatus as set forth in claim 1 for interconnecting a plurality of the circuit boards, comprising in combination:
   a plurality of said electrically conductive carriers stacked together with respective circuit boards enclosed within respective said recesses defined by adjacent said carriers to electrically shield the circuit boards from spurious signals;
   a plurality of said transmission line paths extending through said carriers and said circuit boards, each said path comprising one of said connector assemblies embedded within and feeding through each said carrier to protrude therefrom and a pair of said electrically conductive pads formed on opposing sides of each circuit board in electrical contact with each other, said connector assemblies and said electrically conductive pads being positioned in collinear alignment to form said path, such that each said path is electrically shielded from spurious signals.

6. The interconnect apparatus as set forth in claim 5, wherein selected printed circuits of the circuit boards are electrically connected to selected said transmission line paths.

7. The interconnect apparatus as set forth in claim 5, wherein each said recess is defined by recesses formed within upper and lower surfaces of each said carrier.

8. The interconnect apparatus as set forth in claim 7, wherein said recess formed within said upper surface of each said carrier is defined by an upstanding retaining edge for enclosing the circuit board therein and wherein said recess formed within said lower surface of each said carrier encloses electrical components mounted to the circuit board.

9. The interconnect apparatus as set forth in claim 8, wherein an upper surface of said retaining edge of each carrier is planar and parallel to a planar lower surface of said carriers such that said surfaces are electrically interconnected to fully enclose and shield each said circuit board positioned between adjacent said carriers.

10. The interconnect apparatus as set forth in claim 5, wherein each said connector assemblies embedded within and feeding through respective said carriers comprises a pair of button connectors electrically interconnected and positioned within opposing ends of a dielectric insert positioned within a hole in said carrier in alignment with other connector assemblies in the same transmission path, whereby each said dielectric insert insulate said button connectors positioned therein from respective said carriers and allow the impedance of each said transmission path to be independently preset.

11. The interconnection apparatus as set forth in claim 10, wherein said electrical interconnection of said button connectors comprises electrically conductive plating on the lumen of said dielectric insert.

12. The interconnect apparatus as set forth in claim 10, wherein each said button connector comprises a semispherical end which protrudes from respective said carriers.

13. The interconnect apparatus as set forth in claim 10, wherein each said button connector comprises a cylindrical configuration.

14. The interconnect apparatus as set forth in claim 10, wherein said electrical interconnection of said button connectors comprises a metal conductor positioned therebetween.

15. The interconnect apparatus as set forth in claim 14, wherein said dielectric insert is formed in two sections, each said section including a reduced diameter portion for securing said button connector therein and for securing said metal conductor within said sections of said dielectric insert preventing any axial movement of said metal conductor.

* * * * *